(12) United States Patent
Ishida

(10) Patent No.: US 11,203,731 B2
(45) Date of Patent: Dec. 21, 2021

(54) COMPOSITION FOR SURFACE TREATMENT AND METHOD OF PRODUCING THE SAME, SURFACE TREATMENT METHOD, AND METHOD OF PRODUCING SEMICONDUCTOR SUBSTRATE

(71) Applicant: FUJIMI INCORPORATED, Kiyosu (JP)

(72) Inventor: Yasuto Ishida, Kiyosu (JP)

(73) Assignee: FUJIMI INCORPORATED, Kiyosu (JP)

(*) Notice: Subject to any disclaimer, the term of this patent is extended or adjusted under 35 U.S.C. 154(b) by 115 days.

(21) Appl. No.: 16/491,845

(22) PCT Filed: Jan. 19, 2018

(86) PCT No.: PCT/JP2018/001646
§ 371 (c)(1),
(2) Date: Sep. 6, 2019

(87) PCT Pub. No.: WO2018/163617
PCT Pub. Date: Sep. 13, 2018

(65) Prior Publication Data
US 2021/0130735 A1    May 6, 2021

(30) Foreign Application Priority Data

Mar. 8, 2017    (JP) .............................. JP2017-044133

(51) Int. Cl.
*C11D 7/34*     (2006.01)
*C11D 1/14*     (2006.01)
*C11D 1/22*     (2006.01)
*C11D 1/28*     (2006.01)
*C11D 1/29*     (2006.01)
*C11D 1/34*     (2006.01)
*C11D 3/37*     (2006.01)
*C11D 11/00*    (2006.01)
*H01L 21/02*    (2006.01)

(52) U.S. Cl.
CPC ................. *C11D 1/14* (2013.01); *C11D 1/22* (2013.01); *C11D 1/28* (2013.01); *C11D 1/29* (2013.01); *C11D 1/345* (2013.01); *C11D 3/378* (2013.01); *C11D 11/0047* (2013.01); *H01L 21/02065* (2013.01); *H01L 21/02074* (2013.01)

(58) Field of Classification Search
CPC .................................................. C11D 11/0047
USPC .......................................................... 510/175
See application file for complete search history.

(56) References Cited

U.S. PATENT DOCUMENTS

| | | | |
|---|---|---|---|
| 7,186,498 B2 * | 3/2007 | Gries | G03F 7/322 430/302 |
| 2005/0126588 A1 * | 6/2005 | Carter | C11D 7/265 134/3 |
| 2009/0107520 A1 * | 4/2009 | Lee | C11D 11/0047 134/2 |
| 2009/0133716 A1 * | 5/2009 | Lee | H01L 21/02063 134/3 |
| 2010/0043823 A1 * | 2/2010 | Lee | H01L 21/31111 134/1.3 |
| 2010/0105595 A1 * | 4/2010 | Lee | C11D 7/3272 510/176 |
| 2011/0195888 A1 * | 8/2011 | Kurashima | H01L 21/02074 510/175 |
| 2011/0245127 A1 * | 10/2011 | Suzuki | C11D 1/008 510/163 |
| 2013/0174867 A1 | 7/2013 | Harada | |
| 2015/0140820 A1 | 5/2015 | Kawada | |
| 2016/0005595 A1 * | 1/2016 | Liu | G03F 7/11 438/703 |
| 2019/0177656 A1 * | 6/2019 | Ishida | C11D 1/34 |
| 2019/0194580 A1 * | 6/2019 | Kamimura | C11D 7/261 |
| 2019/0300821 A1 * | 10/2019 | Yoshizaki | C11D 3/3776 |
| 2020/0294808 A1 * | 9/2020 | Ishida | H01L 21/02052 |

FOREIGN PATENT DOCUMENTS

| | | |
|---|---|---|
| JP | 2007-053214 A | 3/2007 |
| JP | 2010-163608 A | 7/2010 |
| JP | 2012-074678 A | 4/2012 |
| WO | WO-2013/162020 A1 | 10/2013 |

* cited by examiner

*Primary Examiner* — Gregory E Webb
(74) *Attorney, Agent, or Firm* — Foley & Lardner LLP

(57) ABSTRACT

The purpose of the present invention is to provide means for sufficiently removing residues on a surface of an object which has been polished including silicon nitride, silicon oxide, or polysilicon.

Provided is a composition for surface treatment including an anionic surfactant having a molecular weight of 1,000 or less and water, the composition having a pH of less than 7, wherein a ratio of a molecular weight of a hydrophilic moiety to a molecular weight of a hydrophobic moiety (the molecular weight of the hydrophilic moiety/the molecular weight of the hydrophobic moiety) of the anionic surfactant is 0.4 or more (in which the hydrophobic moiety is a hydrocarbon group having 4 or more carbon atoms and the hydrophilic moiety is a part excluding the hydrophobic moiety and a counterion), and the composition for surface treatment is used for surface treatment of an object which has been polished including at least one selected from the group consisting of silicon nitride, silicon oxide, and polysilicon.

16 Claims, No Drawings

COMPOSITION FOR SURFACE TREATMENT AND METHOD OF PRODUCING THE SAME, SURFACE TREATMENT METHOD, AND METHOD OF PRODUCING SEMICONDUCTOR SUBSTRATE

TECHNICAL FIELD

The present invention relates to a composition for surface treatment and a method of producing the same, a surface treatment method, and a method of producing a semiconductor substrate.

BACKGROUND ART

In recent years, due to multilayer wiring of a surface of a semiconductor substrate, when manufacturing a device, technology of physically polishing and planarizing a semiconductor substrate, a so-called chemical mechanical polishing (CMP) is used. CMP is a method of planarizing a surface of an object to be polished (polishing object) such as a semiconductor substrate, using a polishing composition (slurry) including abrasive grains such as silica, alumina, and ceria, a corrosion inhibitor, a surfactant, and the like, and the object to be polished (polishing object) is a wire, a plug, or the like made of silicon, polysilicon, silicon oxide, silicon nitride, metal, or the like.

On the surface of the semiconductor substrate after the CMP step, a large amount of impurities (foreign matters) remains. Impurities include abrasive grains derived from a polishing composition used in CMP, a metal, a corrosion inhibitor, an organic material such as a surfactant, a silicon-containing material which is an object to be polished, a silicon-containing material and metal produced by polishing a metal wiring, a plug, and the like, an organic material such as pad waste produced by various pads and the like, and the like. In the present specification, the impurities remaining in the object to be polished after the polishing are also referred to as a residue (defect).

When the surface of a semiconductor substrate is contaminated with these residues, the electrical properties of the semiconductor may be adversely affected and device reliability may be reduced. Therefore, it is desired to introduce a surface treatment step such as rinse polishing or cleaning after a CMP step and to remove the residues from the surface of the semiconductor substrate.

As such a composition for surface treatment, for example, JP 2012-74678 A (corresponding to the specification of US 2013/0174867) discloses a cleaning solution for a semiconductor device including a polycarboxylic acid or a hydroxycarboxylic acid, a sulfonic acid type anionic surfactant, a carboxylic acid type anionic surfactant, and water. According to JP 2012-74678 A, the residues can be removed without corroding the substrate surface by the cleaning solution for a semiconductor device.

SUMMARY OF INVENTION

However, according to the present inventor's review, when the cleaning solution for a semiconductor device (also referred to as a cleaning composition) described in JP 2012-74678 A was applied to cleaning of an object which has been polished including silicon nitride, silicon oxide, or polysilicon, it was found that there is a problem in that the residues cannot be sufficiently removed.

The present invention has been made in view of the above problem, and an object of the present invention is to provide means for sufficiently removing the residues on the surface of the object which has been polished including silicon nitride, silicon oxide, or polysilicon.

The present inventor intensively studied in view of the above problem. As a result, it has been found that the effect of removing residues on the surface of an object which has been polished including silicon nitride, silicon oxide, or polysilicon is significantly improved, by setting a ratio of a molecular weight of a hydrophilic moiety to a molecular weight of a hydrophobic moiety in the anionic surfactant contained in the composition for surface treatment to a specific range, thereby completing the present invention.

That is, the above-mentioned subject of the present invention is solved by the following means.

A composition for surface treatment including an anionic surfactant having a molecular weight of 1,000 or less and water, the composition for surface treatment having a pH of less than 7, wherein a ratio of a molecular weight of a hydrophilic moiety to a molecular weight of a hydrophobic moiety (the molecular weight of the hydrophilic moiety/the molecular weight of the hydrophobic moiety) of the anionic surfactant is 0.4 or more (in which the hydrophobic moiety is a hydrocarbon group having 4 or more carbon atoms and the hydrophilic moiety is a part excluding the hydrophobic moiety and a counterion), and the composition for surface treatment is used for surface treatment of an object which has been polished including at least one selected from the group consisting of silicon nitride, silicon oxide, and polysilicon.

DESCRIPTION OF EMBODIMENTS

Hereinafter, embodiments of the present invention will be described.

<Composition for Surface Treatment>

According to an embodiment of the present invention, there is provided a composition for surface treatment including an anionic surfactant having a molecular weight of 1,000 or less and water, the composition for surface treatment having a pH of less than 7, wherein a ratio of a molecular weight of a hydrophilic moiety to a molecular weight of a hydrophobic moiety (the molecular weight of the hydrophilic moiety/the molecular weight of the hydrophobic moiety) of the anionic surfactant is 0.4 or more (in which the hydrophobic moiety is a hydrocarbon group having 4 or more carbon atoms and the hydrophilic moiety is a part excluding the hydrophobic moiety and a counterion), and the composition for surface treatment is used for surface treatment of an object which has been polished including at least one selected from the group consisting of silicon nitride, silicon oxide, and polysilicon. According to the composition for surface treatment of the present invention, it is possible to sufficiently remove residues on the surface of the object which has been polished including silicon nitride, silicon oxide, or polysilicon. In addition, in the present specification, "a polymer compound having a sulfonic acid (salt) group" is also simply referred to as "a polymer compound". Also, "an anionic surfactant having a molecular weight of 1,000 or less and a molecular weight of a hydrophilic moiety/a molecular weight of a hydrophobic moiety of 0.4 or more" is simply referred to as "an anionic surfactant".

As described above, according to the present inventor's review, when the cleaning composition described in JP 2012-74678 A is applied to cleaning of an object which has been polished including silicon nitride, silicon oxide, or polysilicon, it was found that there is a problem in that residues (particularly, organic residues) cannot be sufficiently removed. When the present inventor reviewed the reason, one of the reasons was considered to be that silicon nitride, silicon oxide, or polysilicon included in the object which has been polished has high hydrophobicity of the surface, so that the cleaning composition is difficult to be adapted to the surface of the object which has been polished and does not have sufficient wettability.

The present inventor conducted repeated studies for solving the problem, and as a result, has found that an anionic surfactant having a ratio of the molecular weight of the hydrophilic moiety to the molecular weight of the hydrophobic moiety (the molecular weight of the hydrophilic moiety/the molecular weight of the hydrophobic moiety) of 0.4 or more is used in the composition for surface treatment, thereby significantly improving the effect of removing the residues (particularly, organic residues) on the surface of the object which has been polished including silicon nitride, silicon oxide, or polysilicon, and completed the present invention.

The reason of remarkable improvement in the removal performance of the residues by using the anionic surfactant having the ratio of the molecular weight of the hydrophilic moiety to the molecular weight of the hydrophobic moiety (the molecular weight of the hydrophilic moiety/the molecular weight of the hydrophobic moiety) of 0.4 or more is not clear, but the present inventor presumes as follows.

That is, the fact that the molecular weight of the hydrophilic moiety/the molecular weight of the hydrophobic moiety in the anionic surfactant is 0.4 or more means that the molecular weight of the hydrophilic moiety in the anionic surfactant is relatively large and the molecular weight of the hydrophobic moiety is relatively small. Among these, it is considered that the relatively large molecular weight of the hydrophilic moiety improves wettability to the surface of the object which has been polished. Also, since the surface of the object which has been polished is hydrophobic, when the composition for surface treatment is brought into contact with the surface of the object which has been polished, the hydrophobic moiety of the anionic surfactant is arranged at an interface between the object which has been polished and the composition for surface treatment (solid-liquid interface) and adsorbed on the surface of the object which has been polished. At this time, it is considered that due to the small molecular weight of the hydrophobic moiety of the anionic surfactant, the anionic surfactant molecules in the composition for surface treatment can be smoothly moved and the arrangement of the hydrophobic moiety at the interface and the adsorption of the hydrophobic moiety to the surface of the object which has been polished proceed in a shorter time.

In order to confirm the mechanism of the arrangement and adsorption of the hydrophobic moiety, the present inventor compared the dynamic surface tension of a composition for surface treatment using an anionic surfactant having the molecular weight of the hydrophilic moiety/the molecular weight of the hydrophobic moiety of 0.4 or more with the dynamic surface tension of a composition for surface treatment using an anionic surfactant having the ratio less than 0.4 by a maximum bubble pressure method. As a result, it was confirmed that the dynamic surface tension value at a bubble lifetime of 25 msec of the composition for surface treatment using the anionic surfactant having the ratio of 0.4 or more was significantly lower. The dynamic surface tension is measured by the maximum bubble pressure method, thereby capable of evaluating the temporal change of the surface tension at the gas-liquid interface (that is, the interface between the air and the composition for surface treatment). Since air is more hydrophobic than water which is a solvent for the composition for surface treatment, the hydrophobic moiety of the anionic surfactant is arranged/adsorbed at the gas-liquid interface in contact with air and the surface tension is decreased. Since this phenomenon is considered to be similar to the phenomenon that the hydrophobic moiety is arranged/adsorbed at the solid-liquid interface between the object which has been polished and the composition for surface treatment, it is considered that the behavior of the dynamic surface tension at the solid-liquid interface between the object which has been polished and the composition for surface treatment can be presumed by capturing the behavior of the dynamic surface tension at the gas-liquid interface by the maximum bubble pressure method. From the above, the present inventor presumed that according to the composition for surface treatment using the anionic surfactant having the molecular weight of the hydrophilic moiety/the molecular weight of the hydrophobic moiety of 0.4 or more, the hydrophobic moiety is arranged/adsorbed in a shorter time at the solid-liquid interface between the object which has been polished and the composition for surface treatment, thereby significantly improving the effect of removing the residues on a highly hydrophobic surface of the object which has been polished including silicon nitride, silicon oxide, or polysilicon. Also, since this phenomenon is considered to occur similarly at the solid-liquid interface between the residues (particularly, highly hydrophobic organic residues) and the composition for surface treatment, it is presumed that the effect of removing the residues (particularly, highly hydrophobic organic residues) is also significantly improved.

In addition, the mechanism is only based on the presumption and its correctness does not affect the patentability of the present invention.

Hereinafter, the constitution of the composition for surface treatment of the present embodiment will be described.

[Anionic Surfactant]

The composition for surface treatment of the present embodiment essentially includes a specific anionic surfactant. The anionic surfactant is considered to serve to improve the adsorption rate of the composition for surface treatment on the object which has been polished and/or the residues, simultaneously with serving to improve wettability to the object which has been polished and/or the residues.

The molecular weight of the anionic surfactant is essentially 1,000 or less. When the molecular weight is more than 1,000, there is a possibility that the effect of residue removal cannot be sufficiently obtained. The reason therefor is presumed to be a decrease in a moving speed of the anionic surfactant molecules in the composition for surface treatment. From a similar point of view, the molecular weight is preferably 900 or less and more preferably 800 or less.

Also, the lower limit of molecular weight of the anionic surfactant is not particularly limited, but is preferably 200 or more. When the molecular weight is 200 or more, the effect of removing the residues is further improved. The reason therefor is presumed to be that the hydrophobicity of the hydrophobic moiety and the hydrophilicity of the hydrophilic moiety in the anionic surfactant can be sufficiently secured, whereby the adsorption rate to the object which has been polished and/or the residues is further improved and the wettability to the object which has been polished and/or the residues is further improved. From a similar point of view, the molecular weight is more preferably 300 or more and still more preferably 400 or more. In addition, in the present specification, as the molecular weight of the anionic surfactant, a value calculated from the sum of the atomic weight is adopted.

The anionic surfactant has a hydrophilic moiety having a hydrophilic group and a hydrophobic moiety having a hydrophobic group. Here, in the present specification, the hydrophobic moiety refers to a hydrocarbon group having 4 or more carbon atoms. This is because the hydrocarbon group having 4 or more carbon atoms is considered to have certain hydrophobicity in the anionic surfactant. In addition, when one molecule of the anionic surfactant has a plurality of hydrocarbon groups having 4 or more carbon atoms, each of the plurality of hydrocarbon groups corresponds to the hydrophobic moiety. At this time, the "molecular weight of the hydrophobic moiety" described later is a value obtained by totaling up the molecular weight of the plurality of hydrocarbon groups. Meanwhile, in the present specification, the hydrophilic moiety means a part excluding the hydrophobic moiety and a counterion (cation). In addition, the counterion (cation) also includes a proton ($H^+$).

In the present embodiment, it is essential that the anion surfactant has the molecular weight of the hydrophilic moiety/the molecular weight of the hydrophobic moiety of 0.4 or more. When the molecular weight of the hydrophilic moiety/the molecular weight of the hydrophobic moiety is less than 0.4, the residues (particularly, organic residues) on the surface of the object which has been polished including silicon nitride, silicon oxide, or polysilicon cannot be sufficiently removed. As the reason therefor, the following two reasons are considered. That is, when the molecular weight of the hydrophilic moiety/the molecular weight of the hydrophobic moiety is less than 0.4, (i) since the molecular weight of the hydrophobic moiety is relatively large, the adsorption rate of the hydrophobic moiety on the object which has been polished and/or the residues is low, the composition for surface treatment is difficult to be adapted to the object which has been polished and/or the residues, and the effect of removing the residues cannot be sufficiently exhibited; (ii) since the molecular weight of the hydrophilic moiety is relatively small, affinity with water which is the solvent of the composition for surface treatment is not sufficient, the wettability to the object which has been polished and/or the residues is decreased, and the effect of residue removal cannot be sufficiently exhibited. From a similar point of view, it is preferred that the molecular weight of the hydrophilic moiety/the molecular weight of the hydrophobic moiety is higher than the lower limit thereof, and specifically, the ratio is preferred in the order of 0.5 or more, 0.6 or more, 0.9 or more, 1.7 or more, 2.0 or more, 2.2 or more, 2.8 or more, 3.0 or more, and 3.2 or more. Meanwhile, though the upper limit of the molecular weight of the hydrophilic moiety/the molecular weight of the hydrophobic moiety is not particularly limited, it is preferably 10 or less, more preferably 7 or less, further preferably 5 or less, particularly preferably 4 or less, and most preferably 3.5 or less, from the viewpoint of securing sufficient hydrophobic performance to adsorb the hydrophobic moiety to the object which has been polished and/or the residues or sufficient hydrophilic performance to maintain wettability to the object which has been polished and/or the residues.

Examples of a hydrophilic group possessed by the hydrophilic moiety of the anionic surfactant include an anionic group which is dissociated in water to produce an anion (negative ion) and a polyoxyalkylene group. The anionic group is not particularly limited, but examples thereof include a sulfonic acid (salt) group, a sulfuric acid (salt) group, a phosphoric acid (salt) group, a carboxylic acid (salt) group, or the like. Among them, the anionic group is preferably a sulfonic acid (salt) group, a sulfuric acid (salt) group, or a phosphoric acid (salt) group, and more preferably a sulfonic acid (salt) group or a sulfuric acid (salt) group (that is, in the composition for surface treatment according to the preferred embodiment of the present invention, the anionic surfactant has a sulfonic acid (salt) group or a sulfuric acid (salt) group). By having the anionic group, removal performance of the residues (particularly, organic residues) on the surface of the object which has been polished including silicon nitride, silicon oxide or polysilicon can be further improved. The reason therefor is presumed to be that since the anionic surfactant having the anionic group (particularly, a sulfonic acid (salt) group or a sulfuric acid (salt) group) has a low pKa, when the pH of a cleaning agent is low (for example, about pH 2), the anionic surfactant can be sufficiently dissociated and is likely to be electrostatically adsorbed on a positively charged surface of the object which has been polished or residues. In addition, in the present specification, " . . . acid (salt) group" refers to " . . . acid group" or an acid group at least a part of which is in the form of a salt. For example, "a sulfonic acid (salt) group" refers to a sulfonic acid group ($-SO_3H$) or a sulfonic acid salt group ($-SO_3M^1$; wherein $M^1$ is an organic or inorganic cation).

Also, the polyoxyalkylene group is not particularly limited, but is preferably a polyoxyethylene (POE) group having 1 to 10 repeating units.

Examples of the anionic surfactant are not particularly limited, but include preferably alkyl sulfuric acid (salt), alkyl phosphoric acid (salt), alkyl naphthalene sulfonic acid (salt), alkyl benzene sulfonic acid (salt), polyoxyalkylene alkyl sulfuric acid (salt), polyoxyalkylene styrenated phenyl sulfuric acid (salt), polyoxyalkylene alkyl sulfosuccinic acid (salt), and polyoxyalkylene alkyl phosphoric acid (salt). Here, the alkyl group is not particularly limited, but is preferably a straight chain or branched chain alkyl group. The lower limit of the number of the carbon atoms of the alkyl group is preferably 8 or more, and more preferably 10 or more. Meanwhile, the upper limit of the number of the carbon atoms of the alkyl group is preferably 40 or less, more preferably 30 or less, and further preferably 20 or less.

At least a part of the anionic group of the anionic surfactant may be in the form of a salt. Examples of the salt include alkali metal salts such as a sodium salt, salts of Group 2 elements such as a calcium salt, an amine salt, an ammonium salt, and the like. In particular, when the object which has been polished is a semiconductor substrate after the CMP step, an amine salt or an ammonium salt is preferred from a viewpoint of removing a metal on a substrate surface as much as possible.

Specific examples of the anionic surfactant include alkyl sulfate, sodium alkyl ether phosphate, sodium alkyl naphthalene sulfonate, sodium alkyl benzene sulfonate, polyoxyethylene lauryl ether ammonium sulfate, polyoxyethylene styrenated phenyl ether ammonium sulfate, polyoxyethylene styrenated phenyl ether ammonium sulfate, polyoxyethylene isodecyl ether ammonium sulfate, sodium polyoxyethylene alkyl(12-14) sulfosuccinate, disodium polyoxyethylene lauryl sulfosuccinate, and polyoxyethylene alkyl(10-12) ether phosphate ester.

In addition, the anionic surfactant can be used alone or in combination of two or more.

It is preferred that a content of the anionic surfactant is 0.01% by mass or more, based on the total mass of the composition for surface treatment. When the content is 0.01% by mass or more, it is possible to improve affinity of the composition for surface treatment to the object which has been polished and to wet the surface of the object which has been polished, and thus, the residues (particularly, organic residues) on the surface of the object which has been polished including silicon nitride, silicon oxide, or polysilicon can be sufficiently removed. From a similar point of view, the content of the anionic surfactant is preferably 0.015% by mass or more, and more preferably 0.02% by mass or more, based on the total mass of the composition for surface treatment. Meanwhile, it is preferred that the content of the anionic surfactant is 1.0% by mass or less, based on the total mass of the composition for surface treatment. When the content is 1.0% by mass or less, it is possible to reduce the residues derived from the anionic surfactant produced on the surface of the object which has been polished, and thus, the number of defects can be reduced. From a similar point of view, the content of the anionic surfactant is preferably 0.1% by mass or less, and more preferably 0.05% by mass or less, based on the total mass of the composition for surface treatment.

In addition, the composition for surface treatment of the present embodiment may include a surfactant other than the anionic surfactant described above (hereinafter, referred to as other surfactants). Here, examples of other surfactants include cationic surfactants, nonionic surfactants, and zwitterionic surfactants, in addition to the anionic surfactants having the molecular weight of the hydrophilic moiety/the molecular weight of the hydrophobic moiety of less than 0.4. However, it goes without saying that it is preferred that the ratio of the content of other surfactants to the content of the anionic surfactant according to the present embodiment is low, from the viewpoint of sufficiently exhibiting the effect of the composition for surface treatment. Specifically, the content of other surfactants to the content of the entire surfactants (the total amount of the content of the anionic surfactant according to the present embodiment and the content of other surfactants) included in the composition for surface treatment is preferably 20% by mass or less, more preferably 10% by mass or less, further preferably 5% by mass or less, particularly preferably 3% by mass or less, and most preferably 0% by mass. In other words, the content of the anionic surfactant according to the present embodiment to the content of the entire surfactants (the total amount of the content of the anionic surfactant according to the present embodiment and the content of other surfactants) included in the composition for surface treatment is preferably 80% by mass or more, more preferably 90% by mass or more, further preferably 95% by mass or more, particularly preferably 97% by mass or more, and most preferably 100% by mass.

As described above, in the composition for surface treatment of the present embodiment, since it is preferred that the anionic surfactant has a sulfonic acid (salt) group, a sulfuric acid (salt) group, or a phosphoric acid (salt) group, the content of the anionic surfactant having a sulfonic acid (salt) group, a sulfuric acid (salt) group, or a phosphoric acid (salt) group to the content of the entire anionic surfactants included in the composition for surface treatment is preferably 50% by mass or more, more preferably 70% by mass or more, further preferably 80% by mass or more, particularly preferably 90% by mass or more, and most preferably 95% by mass or more. The upper limit is 100% by mass.

In addition, in the composition for surface treatment of the present embodiment, since it is preferred that the anionic surfactant has a sulfonic acid (salt) group or a sulfuric acid (salt) group, the content of the anionic surfactant having a sulfonic acid (salt) group or a sulfuric acid (salt) group to the content of the entire anionic surfactants included in the composition for surface treatment is preferably 50% by mass or more, more preferably 70% by mass or more, further preferably 80% by mass or more, particularly preferably 90% by mass or more, and most preferably 95% by mass or more. The upper limit is 100% by mass.

[Polymer Compound Having Sulfonic Acid (Salt) Group]

It is preferred that the composition for surface treatment of the present embodiment further includes a polymer compound of a molecular weight of 10,000 or more, having a sulfonic acid (salt) group. The polymer compound having a sulfonic acid (salt) group contributes to removal of residues by the composition for surface treatment. Therefore, the composition for surface treatment including the polymer compound having a sulfonic acid (salt) group can sufficiently remove the residues (particularly, organic residues) on the surface of the object which has been polished in treatment (such as cleaning) of the surface of the object which has been polished.

The polymer compound having a sulfonic acid (salt) group can form micelles due to affinity between a portion other than the sulfonic acid (salt) group (that is, a polymer chain portion of the polymer compound having a sulfonic acid (salt) group) and the residues (in particular, a hydrophobic component). Therefore, it is considered that the residue which is the hydrophobic component is also effectively removed by dissolving or dispersing the micelles in the composition for surface treatment.

Also, when the surface of the object which has been polished is cationic under an acidic condition, the sulfonic acid (salt) group is anionized, thereby being easily adsorbed on the surface of the object which has been polished. As a result, it is considered to be in a state in which the surface of the object which has been polished is covered with the polymer compound having a sulfonic acid (salt) group. On the other hand, since the sulfonic acid (salt) group of the polymer compound having a sulfonic acid (salt) group is easily adsorbed on the residues (particularly, the residues being easily cationized), the surface of the residues are anionized. Therefore, the residues of which the surface becomes anionic and the anionized sulfonic acid (salt) group of the polymer compound having a sulfonic acid (salt) group adsorbed on the surface of the object which has been polished electrostatically repel each other. Also, when the residues are anionic, the residues themselves and the anionized sulfonic acid (salt) group present on the object which has been polished electrostatically repel each other. Therefore, it is considered that the residues can be effectively removed by using the electrostatic repulsion.

Furthermore, when the object which has been polished is difficult to be charged, it is presumed that the residues are removed by a mechanism different from the above. First, it is considered that the residues (in particular, a hydrophobic component) are in the state of being easily attached to the hydrophobic object which has been polished by hydrophobic interaction. Here, a polymer chain portion (hydrophobic structural site) of the polymer compound having a sulfonic acid (salt) group is directed to the surface side of the object which has been polished due to the hydrophobicity thereof, and on the other hand, the anionized sulfonic acid (salt) group or the like which is a hydrophilic structural site is directed to the opposite side to the surface side of the object which has been polished. Thus, it is presumed that the surface of the object which has been polished is in the state of being covered with an anionized sulfonic acid (salt) group and becomes hydrophilic. As a result, it is considered that it is difficult for hydrophobic interaction to occur between the residue (in particular, a hydrophobic component) and the object which has been polished, and adhesion of the residues is suppressed.

Then, the anionic surfactant adsorbed on the surface of the object which has been polished and the polymer compound having a sulfonic acid (salt) group are easily removed by further washing with water or the like.

The polymer compound having a sulfonic acid (salt) group is not particularly limited as long as it has a plurality of sulfonic acid (salt) groups, and known compounds can be used. Examples of the polymer compound having a sulfonic acid (salt) group include a polymer compound obtained by sulfonating a polymer compound as a base, a polymer compound obtained by (co) polymerizing a monomer having a sulfonic acid (salt) group, and the like.

More specifically, sulfonic acid (salt) group-containing polyvinyl alcohol (sulfonic acid (salt)-modified polyvinyl alcohol), sulfonic acid (salt) group-containing polystyrene such as sodium polystyrene sulfonate, sulfonic acid (salt) group-containing polyvinyl acetate (sulfonic acid (salt)-modified polyvinyl acetate), sulfonic acid (salt) group-containing polyester, a copolymer of (meth)acryl group-containing monomer-sulfonic acid (salt) group-containing monomer such as a copolymer of a (meth)acrylate-sulfonic acid (salt) group-containing monomer, and the like can be included. In addition, in the present specification, the expression "(meth)acryl" represents "acryl" and/or "methacryl", and the expression "(meth)acrylate" represents "acrylate" and/or "methacrylate", respectively. The polymer compound having a sulfonic acid (salt) group can be used alone or in combination of two or more. Examples of the salts where the polymer compound has the sulfonic acid salt group include alkali metal salts such as a sodium salt and a potassium salt, Group 2 element salts such as a calcium salt and a magnesium salt, an amine salt, an ammonium salt, and the like. In particular, when the object which has been polished is a semiconductor substrate after the CMP step, the salt is preferably a sodium salt or an ammonium salt and more preferably an ammonium salt, from a viewpoint of removing metal on the substrate surface as much as possible.

Also, when the polymer compound having a sulfonic acid (salt) group is a sulfonic acid (salt) group-containing polyvinyl alcohol, a degree of saponification of 80% or more is preferred and a degree of saponification of 85% or more is preferred (upper limit of 100%) from a viewpoint of solubility.

In the present embodiment, the weight average molecular weight the polymer compound having a sulfonic acid (salt) group is 10,000 or more. When the weight average molecular weight is 10,000 or more, a removal effect of the residues is further enhanced. The reason therefor is presumed to be that the covering property becomes better when covering the object which has been polished and/or the residues, and an action of removing the residues from the surface of the object which has been polished or an action of suppressing re-adhesion of the organic residues on the surface of the object which has been polished is further improved. From a similar point of view, the weight average molecular weight is more preferably 13,000 or more and further preferably 15,000 or more.

Also, though the upper limit of the weight average molecular weight of the polymer compound having a sulfonic acid (salt) group is not particularly limited, 100,000 or less is preferred. When the weight average molecular weight is 100,000 or less, the effect of removing the residues is further high. The reason therefor is presumed to be that the removability of the polymer compound having a sulfonic acid (salt) group after a cleaning step becomes better. From a similar point of view, the weight average molecular weight is more preferably 50,000 or less and further preferably 40,000 or less.

The weight average molecular weight can be measured by gel permeation chromatography (GPC). A measurement method of the weight average molecular weight will be described in detail in the Examples.

As the polymer compound having a sulfonic acid (salt) group, a commercially available product may be used, and for example, Gohseinex (registered trademark) L-3226 and Gohseinex (registered trademark) CKS-50 manufactured by Nippon Synthetic Chemical Industry Co., Ltd., Aron (registered trademark) A-6012, A-6016A, and A-6020 manufactured by Toagosei Co., Poly NaSS (registered trademark) PS-1 manufactured by Tosoh Organic Chemical Co., Ltd., and the like can be used.

It is preferred that the content of the polymer compound having a sulfonic acid (salt) group is 0.001% by mass or more, based on the total mass of the composition for surface treatment. When the content of the polymer compound having a sulfonic acid (salt) group is 0.001% by mass or more, the effect of removing the residues is further improved. The reason therefor is presumed to be that when the object which has been polished and the residues are covered with the polymer compound having a sulfonic acid (salt) group, a larger area is covered. Thus, in particular, since the residues form micelles more easily, the effect of removing the residues by dissolution and dispersion of the micelles is improved. Also, it is presumed that the number of sulfonic acid (salt) groups is increased, thereby capable of expressing an electrostatic adsorption or repulsion effect more strongly. From a similar point of view, the content of the polymer compound having a sulfonic acid (salt) group is preferably 0.003% by mass or more and further preferably 0.005% by mass or more, based on the total mass of the composition for surface treatment. Also, it is preferred that the content of the polymer compound having a sulfonic acid (salt) group is 1.0% by mass or less, based on the total mass of the composition for surface treatment. When the content of the polymer compound having a sulfonic acid (salt) group is 1.0% by mass or less, the effect of removing the residues is further enhanced. The reason therefor is presumed to be that the removability of the polymer compound having a sulfonic acid (salt) group itself after the surface treatment step becomes good. From a similar point of view, the content of the polymer compound having a sulfonic acid (salt) group is more preferably 0.7% by mass or less, further preferably 0.5% by mass or less, particularly preferably 0.3% by mass or less, and most preferably less than 0.1% by mass, based on the total mass of the composition for surface treatment.

It is preferred that a ratio of the content (mass) of the anionic surfactant to the content (mass) of the polymer compound having a sulfonic acid (salt) group is 1 or more. When the ratio is 1 or more, the residues (particularly, organic residues) and the object which has been polished can be sufficiently hydrophilized. The reason therefor is presumed to be that since the number of residues (particularly, organic residues) separated from the object which has been polished by surface potential control of the polymer compound is increased by dispersion, a sufficient amount of surfactant for hydrophilizing the surface is required. From a similar point of view, the ratio is more preferably 1.5 or more and further preferably 2 or more. Also, it is preferred that the ratio of the content (mass) of the anionic surfactant to the content (mass) of the polymer compound having a sulfonic acid (salt) group is 100 or less. When the ratio is 100 or less, the surfactant-derived residues can be reduced. Also, when the amount of surfactant is too large, a frictional force between a cleaning brush and the object which has been polished is small so that the residues cannot be sufficiently removed; however, when the ratio is 100 or less, a frictional force sufficient for removing the residues from the object which has been polished can be obtained. From a similar point of view, the ratio is more preferably 50 or less and further preferably 10 or less.

In addition, the composition for surface treatment of the present embodiment may include other polymer compound having a weight average molecular weight of 10,000 or more, in addition to the polymer compound having a sulfonic acid (salt) group. In addition, as the weight average molecular weight, a value measured by the method described in the Examples is adopted.

On this occasion, it is preferred that the content of the polymer compound having a sulfonic acid (salt) group is more than 80% by mass (upper limit of 100% by mass), based on the total mass of the polymer compound included in the composition for surface treatment. When the content of the polymer compound having a sulfonic acid (salt) group is more than 80% by mass, based on the total mass of the polymer compound included in the composition for surface treatment, the effect of removing the residues is more improved. The reason therefor is presumed to be that the amount of the polymer compound other than the polymer compound having a sulfonic acid (salt) group which can cause the residues after the cleaning step is reduced. Also, it is presumed that when the object which has been polished and the residues are covered with the polymer compound having a sulfonic acid (salt) group, inhibition of covering by the polymer compound other than the polymer compound having a sulfonic acid (salt) group is suppressed. From a similar point of view, it is preferred that the content of the polymer compound having a sulfonic acid (salt) group is more than 95% by mass, based on the total mass of the polymer compound included in the composition for surface treatment. In such a case, the effect of removing the residues is significantly improved.

Furthermore, it is particularly preferred that the content of the polymer compound having a sulfonic acid (salt) group is 100% by mass, based on the total mass of the polymer compound included in the composition for surface treatment. That is, it is particularly preferred that the polymer compound included in the composition for surface treatment is only the polymer compound having a sulfonic acid (salt) group.

In addition, examples of the above "other polymer compound" included in the composition for surface treatment of the present embodiment include the polymer compound used as other additives described later.

[Phosphonic Acid Compound]

It is preferred that the composition for surface treatment of the present embodiment further include a phosphonic acid compound having two or more nitrogen atoms (herein, also simply referred to as "phosphonic acid compound"). The phosphonic acid compound contributes to suppression of tungsten layer dissolution when the object which has been polished contains the tungsten layer. That is, the phosphonic acid compound serves as a dissolution inhibitor which inhibits tungsten layer dissolution or the like.

Also, the phosphonic acid compound can also contribute to suppression of an increase in surface roughness (an increase in an average surface roughness value Ra) of the object which has been polished (specifically, a tungsten layer) when surface treatment is performed. It is considered that the increase in surface roughness of the tungsten layer is due to intergranular corrosion. In contrast, as described above, dissolution of the tungsten layer is suppressed and at the same time, dissolution in a grain boundary of the tungsten layer is suppressed, by the effect of the phosphonic acid compound as an inhibitor. As a result, it is considered that smoothness of the tungsten layer surface is well maintained.

The phosphonic acid compound is not particularly limited as long as it is a compound having two or more nitrogen atoms and one or more phosphonic acid groups (—P(O)(OH)$_2$). In addition, the phosphonic acid group in the composition for surface treatment may be included in the state of a phosphonic acid salt group (—P(O)(OM$^2$)$_2$ or —P(O)(OM$^2$)(OH); wherein M$^2$ is an organic or inorganic cation).

The number of nitrogen atoms of the phosphonic acid compound is 2 or more, and as the number of nitrogen atoms is larger, the phosphonic acid compound is more easily coordinated in the tungsten layer, which is preferred from a viewpoint of suppressing tungsten layer dissolution or the like. Meanwhile, though the upper limit of the number of nitrogen atoms is not particularly limited, 8 or less is preferred, from a viewpoint of more easily removing the phosphonic acid compound itself from the tungsten layer after surface treatment. Furthermore, the number of nitrogen atoms is preferably 2 or more and 6 or less, more preferably 2 or more and 4 or less, and particularly preferably 2 or 3, from a balance between suppression of tungsten layer dissolution or the like and removal easiness of the phosphonic acid compound after surface treatment.

The number of the phosphonic acid group of the phosphonic acid compound is not particularly limited as long as it is 1 or more; however, it is preferably 1 or more and 10 or less and more preferably 2 or more and 6 or less, from a balance between suppression of tungsten layer dissolution or the like and removal easiness of the phosphonic acid compound after surface treatment.

Among them, the phosphonic acid compound included in the composition for surface treatment is preferably a compound represented by the following Formula (1) or a salt thereof:

[Chemical Formula 1]

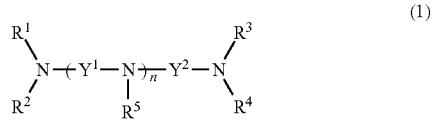

(1)

In the above Formula (1),

Y$^1$ and Y$^2$ denote independently of each other a straight chain or branched chain alkylene group having 1 or more and 5 or less carbon atoms, n denotes an integer of 0 or more and 4 or less, and R$^1$ to R$^5$ denote independently of each other a hydrogen atom or a substituted or unsubstituted straight chain or branched chain alkyl group having 1 or more and 5 or less carbon atoms, in which one or more of R$^1$ to R$^5$ are an alkyl group substituted with a phosphonic acid group.

In the above Formula (1), the straight chain or branched chain alkylene group having 1 or more and 5 or less carbon atoms as Y$^1$ and Y$^2$ is not particularly limited, but includes a straight chain or branched chain alkylene group such as a methylene group, an ethylene group, a trimethylene group, a tetramethylene group, and a propylene group. Among them, a straight chain or branched chain alkylene group having 1 or more and 4 or less carbon atoms is preferred and a straight chain or branched chain alkylene group having 1 or more and 3 or less carbon atoms is more preferred. Furthermore, an alkylene group having one or two carbon atoms, that is, a methylene group and an ethylene group are more preferred and an ethylene group is particularly preferred, from a viewpoint of the effect of suppressing tungsten dissolution or the like and availability.

n in the above Formula (1) denotes the number of (—$Y^1$—$N(R^5)$—) and is an integer of 0 or more and 4 or less. n is preferably an integer of 0 or more and 2 or less and particularly preferably 0 or 1, from a viewpoint of improvement of the effect of suppressing tungsten dissolution or the like and availability. In addition, when n is 2 or more, n (—$Y^1$—$N(R^5)$—)'s may be the same or different.

In the above Formula (1), the substituted or unsubstituted straight chain or branched chain alkyl group having 1 or more and 5 or less carbon atoms as $R^1$ to $R^5$ is not particularly limited, but includes an alkyl group such as a methyl group, an ethyl group, a propyl group, an isopropyl group, a butyl group, an isobutyl group, a sec-butyl group, or a tert-butyl group. Among them, a substituted or unsubstituted straight chain or branched chain alkyl group having 1 or more and 4 or less carbon atoms is preferred and a substituted or unsubstituted straight chain or branched chain alkyl group having 1 or more and 3 or less carbon atoms is more preferred. In addition, a methyl group and an ethyl group are more preferred and a methyl group is particularly preferred, from a viewpoint of the effect of suppressing tungsten dissolution or the like and availability.

Here, the expression "substituted or unsubstituted" for the alkyl group means that one or more hydrogen atoms of the alkyl group may be unsubstituted or substituted with other substituent. Here, the substituent for substitution is not particularly limited. Examples thereof include substituents such as, a fluorine atom (F); a chlorine atom (Cl); a bromine atom (Br); an iodine atom (I); a phosphoric acid group (—$PO_3H_2$); a phosphoric acid group (—$OPO_3H_2$); a sulfonic acid (salt) group (—$SO_3H$); a thiol group (—SH); a cyano group (—CN); a nitro group (—$NO_2$); a hydroxy group (—OH); a straight chain or branched chain alkoxy group having 1 or more and 10 or less carbon atoms (e.g., a methoxy group, an ethoxy group, a propoxy group, an isopropoxy group, a butoxy group, a pentyloxy group, a hexyloxy group, a 2-ethylhexyloxy group, an octyloxy group, a dodecyloxy group, or the like); an aryl group having 6 or more and 30 or less carbon atoms (e.g., a phenyl group, a biphenyl group, a 1-naphthyl group, or a 2-naphthyl group); and a cycloalkyl group having 3 or more and 20 or less carbon atoms (e.g., a cyclopropyl group, a cyclobutyl group, a cyclopentyl group, a cyclohexyl group, or a cycloheptyl group).

In the above Formula (1), one or more of $R^1$ to $R^5$ are an alkyl group substituted with a phosphonic acid group.

The "alkyl group substituted with a phosphonic acid group" is a straight chain or branched chain alkyl group having 1 or more and 5 or less carbon atoms substituted with one or more phosphonic acid groups, and examples thereof include a (mono)phosphonomethyl group, a (mono)phosphonoethyl group, a (mono)phosphono-n-propyl group, a (mono)phosphonoisopropyl group, a (mono)phosphono-n-butyl group, a (mono)phosphonoisobutyl group, a (mono)phosphono-sec-butyl group, a (mono)phosphono-tert-butyl group, a diphosphonomethyl group, a diphosphonoethyl group, a diphosphono-n-propyl group, a diphosphono-isopropyl group, a diphosphono-n-butyl group, a diphosphonoisobutyl group, a diphosphono-sec-butyl group, a diphosphono-tert-butyl group, and the like. Among them, a straight chain or branched chain alkyl group having 1 or more and 4 or less carbon atoms substituted with one phosphonic acid group is preferred and a straight chain or branched chain alkyl group having 1 or more and 3 or less carbon atoms substituted with one phosphonic acid group is more preferred. Furthermore, a (mono)phosphonomethyl group and a (mono)phosphonoethyl group are more preferred and a (mono)phosphonomethyl group is particularly preferred, from a viewpoint of the effect of suppressing tungsten dissolution or the like and availability.

In the above Formula (1), it is preferred that four or more of $R^1$ to $R^5$ are an alkyl group substituted with a phosphonic acid group. Furthermore, it is preferred that all of $R^1$ to $R^4$ is a straight chain or branched chain alkyl group having 1 or more and 5 or less carbon atoms substituted with a phosphonic acid group, and it is particularly preferred that all of $R^1$ to $R^4$ and n $R^5$'s is a straight chain or branched chain alkyl group having 1 or more and 5 or less carbon atoms substituted with a phosphonic acid group, from a viewpoint of the effect of suppressing tungsten dissolution or the like.

In the composition for surface treatment, examples of a particularly preferably used compound include ethylenediamine tetraethylene phosphonic acid, ethylenediamine tetramethylene phosphonic acid (ethylenediamine tetra(methylene phosphonic acid)), diethylenetriamine pentaethylene phosphonic acid, diethylenetriamine pentamethylene phosphonic acid (diethylenetriamine penta(methylene phosphonic acid)), triethylenetetramine hexaethylene phosphonic acid, triethylenetetramine hexamethylene phosphonic acid, propanediamine tetraethylene phosphonic acid, and propanediamine tetramethylene phosphonic acid, and an ammonium salt, a potassium salt, a sodium salt, and a lithium salt of the acids. That is, it is preferred that the phosphonic acid compound according to the present embodiment includes at least one selected from the group consisting of the above-mentioned phosphonic acid compound and salts thereof.

Among them, in view of the effect of suppressing tungsten layer dissolution or the like, availability, and the like, it is more preferred that the phosphonic acid compound includes at least one selected from the group consisting of ethylenediamine tetraethylene phosphonic acid, ethylenediamine tetramethylene phosphonic acid, diethylenetriamine pentaethylene phosphonic acid, diethylenetriamine pentamethylene phosphonic acid, and an ammonium salt, a potassium salt, a sodium salt, and a lithium salt of the acids. Furthermore, it is particularly preferred to include at least one selected from the group consisting of ethylenediamine tetramethylene phosphonic acid and diethylenetriamine pentamethylene phosphonic acid, and an ammonium salt, a potassium salt, a sodium salt, and a lithium salt of the acids.

In addition, the phosphonic acid compound can be used alone or in a combination of two or more.

A content of the phosphonic acid compound is not particularly limited, but is preferably 0.01% by mass or more, based on the total mass of the composition for surface treatment. When the content of the phosphonic acid compound is 0.01% by mass or more, the effect of suppressing tungsten layer dissolution or the like is improved. From a similar point of view, the content of the phosphonic acid compound is preferably 0.02% by mass or more, further preferably 0.05% by mass or more, still more preferably 0.06% by mass or more, and particularly preferably 0.08% by mass or more, based on the total mass of the composition for surface treatment.

Also, the content of the phosphonic acid compound is preferably 5% by mass or less, based on the total mass of the composition for surface treatment. When the content of the phosphonic acid compound is 5% by mass or less, it is easier to remove the phosphonic acid compound itself after surface treatment. From a similar point of view, the content of the phosphonic acid compound is more preferably 3% by mass or less, further preferably 1% by mass or less, and particularly preferably less than 1% by mass, based on the total mass of the composition for surface treatment.

Also, when the composition for surface treatment further includes a polymer compound having a sulfonic acid (salt) group, it is preferred that a mass ratio of the phosphonic acid compound to the polymer compound having a sulfonic acid (salt) group is 0.1 or more. When the mass ratio is 0.1 or more, the effect of suppressing tungsten layer dissolution or the like can be sufficiently obtained. Furthermore, the mass ratio is more preferably 0.2 or more and still more preferably 0.4 or more, from a viewpoint of improving the effect of suppressing tungsten layer dissolution or the like.

Furthermore, it is preferred that the phosphonic acid compound is included more than the polymer compound having a sulfonic acid (salt) group included in the composition for surface treatment. That is, it is preferred that the mass ratio of the phosphonic acid compound to the polymer compound having a sulfonic acid (salt) group is more than 1 (that is, the polymer compound having a sulfonic acid (salt) group: the phosphonic acid compound (mass ratio) =more than 1:1). When the mass ratio is more than 1, the effect of suppressing not only tungsten layer dissolution but also an increase in surface roughness is further improved. The reason therefor is presumed to be that by including the phosphonic acid compound much, the phosphonic acid compound easily forms a complex with the tungsten layer and hydration of the tungsten layer is suppressed.

From a similar point of view, the mass ratio of the phosphonic acid compound to the polymer compound having a sulfonic acid (salt) group (the phosphonic acid compound/the polymer compound having a sulfonic acid (salt) group) is more preferably 1.2 or more and particularly preferably 1.5 or more. The upper limit of the mass ratio is not particularly limited, but preferably 10 or less and more preferably 5 or less, considering removal easiness of the phosphonic acid compound itself after surface treatment.

It is preferred that a molecular weight of the phosphonic acid compound is less than 1,000. When the molecular weight is less than 1,000, removal becomes easy in the process of removing the phosphonic acid compound after surface treatment of the object which has been polished, which is preferred. Meanwhile, the lower limit of the molecular weight of the phosphonic acid compound is not particularly limited, but 120 or more is preferred. In addition, the molecular weight of the phosphonic acid compound can be measured by a gas chromatography-mass spectrometry (GC-MS) method, a mass spectrometry (MS) method such as a HPLC-tandem quadruple mass spectrometry method; a high performance liquid chromatography (HPLC) method, or the like.

[Acid]

It is preferred that the composition for surface treatment of the present embodiment further includes an acid. In addition, in the present specification, the anionic surfactant, the polymer compound having a sulfonic acid (salt) group, and the phosphoric acid compound are treated differently from the acid as an additive described herein. The acid is presumed to serve to positively charge the surface of the object which has been polished including silicon nitride, silicon oxide, or polysilicon or the surface of the residues. Thus, an electrostatic repulsion effect is more promoted by addition of the acid and a removal effect of the residues by the composition for surface treatment is more improved.

As the acid, either an inorganic acid or an organic acid may be used. The inorganic acid is not particularly limited and examples thereof include sulfuric acid, nitric acid, boric acid, carbonic acid, hypophosphorous acid, phosphorous acid, phosphoric acid, and the like. The organic acid is not particularly limited and examples thereof include carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, and methanesulfonic acid, ethanesulfonic acid, isethionic acid, and the like.

Among them, maleic acid or nitric acid is more preferred and maleic acid is further preferred, from a viewpoint that those having a better effect of positively charging the surface of the object which has been polished and the surface of the residues enhance removability of the residues.

In addition, the acid can be used alone or in combination of two or more.

It is preferred that a content of the acid is 0.01% by mass or more, based on the total mass of the composition for surface treatment. When the content of the acid is 0.01% by mass or more, the effect of removing the residues is more improved. The reason therefor is presumed to be that the effect of positively charging the surface of the object which has been polished and the surface of the residues is better. From a similar point of view, the content of the acid is preferably 0.02% by mass or more and further preferably 0.03% by mass or more, based on the total mass of the composition for surface treatment. Also, it is preferred that the content of the acid is 5% by mass or less, based on the total mass of the composition for surface treatment. When the content of the acid is 5% by mass or less, it is preferred from a viewpoint of cost reduction. From a similar point of view, the content of the acid is more preferably 3% by mass or less and further preferably 1% by mass or less, based on the total mass of the composition for surface treatment.

[Other Additives]

The composition for surface treatment of the present embodiment may include other additives at an optional proportion, if necessary, within a range not inhibiting the effect of the present invention. However, since the component other than the essential components of the composition for surface treatment of the present embodiment may cause the residues, it is desired not to add other components if possible. Therefore, it is preferred that an addition amount of the component other than the essential component is as small as possible and it is more preferred that other components are not included. Examples of other additives include abrasive grains, alkali, an antiseptic agent, dissolved gas, a reducing agent, an oxidizing agent, alkanolamines, and the like. Among them, in order to further improve the effect of residue removal, it is preferred that the composition for surface treatment includes substantially no abrasive grains. Here, "including substantially no abrasive grains"

refers to the case where the content of abrasive grains is 0.01% by mass or less, based on the entire composition for surface treatment.

[pH]

It is essential that the pH of the composition for surface treatment of the present embodiment is less than 7. When pH is 7 or more, the effect of positively charging the surface of the object which has been polished or the surface of a positively chargeable component is not obtained and the effect of sufficiently removing the residues (particularly, organic residues) is not obtained. From a similar point of view, pH is more preferably less than 4, further preferably less than 3, and particularly preferably 2.5 or less. Also, it is preferred that pH is 1 or more. When pH is 1 or more, damage to a device caused by a low pH can be reduced.

In addition, the pH of the composition for surface treatment can be confirmed by a pH meter (manufactured by HORIBA, Ltd., model No.: LAQUA (registered trademark)).

When the pH is adjusted, it is desired not to add the component other than the essential components of the composition for surface treatment of the present embodiment which may cause the residues if possible. From this, it is preferred to make an adjustment only with the anionic surfactant, the acid, and the polymer compound having a sulfonic acid (salt) group. However, when it is difficult to obtain the desired pH only by the essential components, the adjustment may be made using other additives such as an alkali which can be optionally added, within a range not inhibiting the effect of the present invention.

[Dispersing Medium]

The composition for surface treatment of the present embodiment essentially includes water as a dispersing medium (solvent). The dispersing medium has a function of dispersing or dissolving each component. It is more preferred that the dispersing medium is only water. Also, the dispersing medium may be a mixed solvent of water and an organic solvent for dispersion or dissolution of each component. In this case, examples of the organic solvent to be used include acetone, acetonitrile, ethanol, methanol, isopropanol, glycerin, ethylene glycol, propylene glycol, and the like which are organic solvents miscible with water. Also, the organic solvents may be used without being mixed with water to disperse or dissolve each component and then be mixed with water. The organic solvent can be used alone or in combination of two or more.

It is preferred that water contains impurities as little as possible, from a viewpoint of inhibiting contamination of the object which has been polished and action of other components. For example, water having a total content of transition metal ions of 100 ppb or less is preferred. Here, a purity of water can be increased by, for example, operations such as removal of impurity ions using an ion exchange resin, removal of residues by a filter, distillation, and the like. Specifically, it is preferred to use deionized water (ion exchange water), pure water, ultrapure water, distilled water, or the like as water.

<Method of Producing Composition for Surface Treatment>

According to another embodiment of the present invention, there is provided a method of producing a composition for surface treatment, including a step of mixing an anionic surfactant having a molecular weight of 1,000 or less with water, the composition for surface treatment having a pH of less than 7, wherein a ratio of a molecular weight of a hydrophilic moiety to a molecular weight of a hydrophobic moiety of the anionic surfactant (the molecular weight of the hydrophilic moiety/the molecular weight of the hydrophobic moiety) is 0.4 or more (in which the hydrophobic moiety is a hydrocarbon group having 4 or more carbon atoms and the hydrophilic moiety is a part excluding the hydrophobic moiety and a counterion). More specifically, the composition for surface treatment can be obtained by stirring and mixing the anionic surfactant and if necessary, other components in water.

Details of the anionic surfactant and water are described above. Also, examples of other components added as required include components such as a polymer compound having a sulfonic acid (salt) group, a phosphonic acid compound, an acid (pH adjusting agent), abrasive grains, an alkali, an antiseptic agent, dissolved gas, a reducing agent, an oxidizing agent, alkanolamines, and an organic solvent. A temperature at which each component is mixed is not particularly limited, but 10 to 40° C. is preferred, and heating may be performed for an increase in a rate of dissolution. Also, a mixing time is not particularly limited.

<Surface Treatment Method>

According to another embodiment of the present invention, there is provided a surface treatment method, including a step of surface-treating an object which has been polished including at least one selected from the group consisting of silicon nitride, silicon oxide, and polysilicon, using the composition for surface treatment. In the present specification, the surface treatment method is a method of reducing the residues remaining on the surface of the object which has been polished and a method of performing cleaning in a broad sense.

According to the surface treatment method of the present embodiment, the residues on the surface of the object which has been polished including silicon nitride, silicon oxide, or polysilicon can be sufficiently removed. That is, according to another embodiment of the present invention, there is provided a method of reducing residues on a surface of the object which has been polished, including a step of surface-treating the object which has been polished including at least one selected from the group consisting of silicon nitride, silicon oxide, and polysilicon, using the composition for surface treatment.

The surface treatment method of the present embodiment is carried out by a method of bringing the composition for surface treatment into direct contact with the object which has been polished.

Examples of the surface treatment method include (I) a method by rinse polishing and (II) a method by cleaning. That is, in the present embodiment, the surface treatment is rinse polishing or cleaning. Rinse polishing and cleaning are performed to remove the residues (particles, metal contamination, organic residues, pad waste, or the like) on the surface of the object which has been polished to obtain a clean surface. The above (I) and (II) will be described below.

(I) Rinse Polishing

The composition for surface treatment according to the present embodiment is appropriately used in rinse polishing. The rinse polishing is performed on a polishing table (platen) to which a polishing pad is attached, for the purpose of removing the residues on the surface of the object to be polished, after final polishing (finish polishing) is performed on the object to be polished. At this time, the rinse polishing is performed by bringing the composition for surface treatment into direct contact with the object which has been polished. As a result, the residues on the surface of the object which has been polished are removed by frictional force (physical action) by a polishing pad and chemical action by the composition for surface treatment. Among the residues, in particular, particles and organic residues are easily removed by physical action. Therefore, in the rinse polishing, particles and organic residues can be effectively removed by using friction with a polishing pad on the polishing table (platen).

Specifically, the rinse polishing can be performed by placing the surface of the object which has been polished after the polishing step on the polishing table (platen) of a polishing apparatus, bringing a polishing pad and an object which has been polished (a polished semiconductor substrate or the like) into contact with each other, and relatively sliding the object which has been polished and the polishing pad while supplying the composition for surface treatment (rinse polishing composition) to the contact portion.

The rinse polishing can be performed using either a single-sided polishing apparatus or a double-sided polishing apparatus. Also, it is preferred that the polishing apparatus is provided with a discharge nozzle of the rinse polishing composition, in addition to a discharge nozzle of the polishing composition. Operating conditions at the time of rinse polishing of the polishing apparatus are not particularly limited and can be appropriately set by a person skilled in the art.

(II) Cleaning

The composition for surface treatment according to the present embodiment can be appropriately used in cleaning. The cleaning is performed for the purpose of removing the residues on the surface of the object to be polished, after final polishing (finish polishing) is performed on the object to be polished or after the rinse polishing is performed. In addition, cleaning and the rinse polishing are classified depending on the place where the treatment is performed and the cleaning is a surface treatment performed after the object which has been polished is removed from the polishing table (platen). In the cleaning also, the composition for surface treatment can be brought into direct contact with the object which has been polished to remove the residues on the surface of the object.

Examples of a method of performing cleaning include (i) a method of bringing a cleaning brush into contact with one side or both sides of the object which has been polished in the state of holding the object which has been polished, and rubbing the surface of the object which has been polished with the cleaning brush while supplying the composition for surface treatment to the contact portion, (ii) a method of immersing the object which has been polished in the composition for surface treatment and performing ultrasonic treatment or agitation (dip type), and the like. In the method, the residues on the surface of the object which has been polished are removed by frictional force by the cleaning brush or mechanical force generated by an ultrasonic treatment or an agitation and chemical action by the composition for surface treatment.

In the method of (i), a method of bringing the composition for surface treatment into contact with the object which has been polished is not particularly limited, but examples thereof include a spin type in which the object which has been polished is rotated at high speed while the composition for surface treatment is flowed from a nozzle onto the object which has been polished, a spray type in which the composition for surface treatment is sprayed on the object which has been polished to clean the object, and the like.

In terms of removing the residues efficiently within a short time, it is preferred to adopt the spin type or the spray type and it is more preferred to adopt the spin type, as the cleaning.

Examples of the apparatus for cleaning include a batch type cleaning apparatus for simultaneously surface-treating a plurality of object which has been polished accommodated in a cassette, a sheet type cleaning apparatus for surface treatment by mounting one sheet of object which has been polished in a holder, and the like. A method of using the sheet type cleaning apparatus is preferred, from a viewpoint of reduction of cleaning time or the like.

Furthermore, examples of the apparatus for cleaning include a polishing apparatus provided with cleaning equipment which rubs the object which has been polished with a cleaning brush after removing the object which has been polished from the polishing table (platen). By using the polishing apparatus, cleaning of the object which has been polished can be performed more efficiently.

As such polishing apparatus, a general polishing apparatus having a holder for holding the object which has been polished, a motor capable of changing the rotation number, a cleaning brush, and the like can be used. As the polishing apparatus, either a single-sided polishing apparatus or a double-sided polishing apparatus may be used. In addition, when a rinse polishing step is performed after a CMP step, it is more efficient and preferred to perform the cleaning using the same apparatus as the polishing apparatus used in the rinse polishing step.

The cleaning brush is not particularly limited, but preferably a brush made of resin is used. The material of the brush made of resin is not particularly limited, but for example, it is preferred to use PVA (polyvinyl alcohol). Then, it is particularly preferred to use a sponge made of PVA as the cleaning brush.

The cleaning conditions are not particularly limited, but can be appropriately set according to the type of the object which has been polished and the type and amount of the residues to be removed. For example, it is preferred that the rotation number of the cleaning brush is 10 rpm or more and 200 rpm or less and the rotation number of the object which has been polished is 10 rpm or more and 200 rpm or less. A method of supplying the composition for surface treatment is also not particularly limited, but for example, a method of continuous supply with a pump or the like (constant flow) is adopted. The supply amount is not limited, but it is preferred that the cleaning brush and the surface of the object which has been polished are always covered with the composition for surface treatment, and 10 mL/min or more and 5000 mL/min or less is preferred. A cleaning time is also not particularly limited, but for a step using the composition for surface treatment of the present embodiment, 5 seconds or more and 180 seconds or less is preferred. Within the range, it is possible to more effectively remove the residues.

A temperature of the composition for surface treatment at the time of cleaning is not particularly limited and may be usually room temperature, but in a range not impairing performance, may be heated to about 40° C. or more and 70° C. or less.

In the method of (ii), the conditions of the cleaning method by immersion are not particularly limited, but a known method can be used.

Before, after, or before and after the cleaning is performed by the methods of (i) and (ii), cleaning by water may be performed.

Also, it is preferred that the object which has been polished after cleaning is dried by removing water droplets adhering to the surface by a spin drier or the like. Also, the surface of the object which has been polished may be dried by air blow drying.

<Method of Producing Semiconductor Substrate>

According to another embodiment of the present invention, there is provided a method of producing a semiconductor substrate, including a step of reducing the residues (particularly, organic residues) on a surface of a semiconductor substrate which has been polished including at least one selected from the group consisting of silicon nitride, silicon oxide, and polysilicon by the surface treatment method.

The detailed description for the semiconductor substrate which has been polished to which the production method of the present embodiment is applied is as described above for the object which has been polished.

The production method of the present embodiment is not particularly limited as long as it includes the step of reducing the residues on the surface of the semiconductor substrate which has been polished, and an example thereof includes a method including a polishing step for forming the semiconductor substrate which has been polished and a cleaning step. Also, other examples thereof include a method including a rinse step for reducing the residues on the surface of the semiconductor substrate which has been polished between the polishing step and the cleaning step, in addition to the polishing step and the cleaning step.

[Polishing Step]

The polishing step which can be included in a method of producing a semiconductor substrate of the present embodiment is a step of polishing the semiconductor substrate including silicon nitride, silicon oxide, or polysilicon to form the semiconductor substrate which has been polished.

The polishing step is not particularly limited as long as it is a step of polishing the semiconductor substrate, but is preferably a chemical mechanical polishing (CMP) step. Also, the polishing step may be a polishing step including a single step or a polishing step including a plurality of steps. Examples of the polishing step including a plurality of steps include a step of performing a finish polishing step after a preliminary polishing step (coarse polishing step), a step of performing a secondary polishing steps once or twice or more times after a primary polishing step, and then performing a finish polishing step, or the like.

As the polishing composition, a known polishing composition can be appropriately used, depending on the characteristics of the semiconductor substrate. The polishing composition is not particularly limited, but for example, those containing abrasive grains, acid salts, a dispersing medium, an acid, and the like can be preferably used. Specific examples of the polishing composition include a polishing composition containing sulfonic acid modified colloidal silica, ammonium sulfate, a water and maleic acid, and the like.

As the polishing apparatus, a general polishing apparatus on which a holder for holding the object to be polished and a motor capable of changing the rotation number, and the like are mounted and having a polishing table to which a polishing pad (polishing cloth) can be attached, can be used. As the polishing apparatus, either a single-sided polishing apparatus or a double-sided polishing apparatus may be used. As the polishing apparatus, specifically, for example, FREX300E manufactured by Ebara Corporation, or the like can be preferably used.

As the polishing pad, general non-woven fabric, polyurethane, porous fluororesin, and the like can be used without particular limitation. It is preferred that the polishing pad is grooved so that the polishing composition is accumulated. Specifically, as the polishing pad, for example, a rigid polyurethane pad IC1400 manufactured by Nitta Haas Incorporated, or the like can be preferably used.

The polishing conditions are not particularly limited, but for example, the rotation number of the polishing table and the rotation number of a head (carrier) are preferably 10 rpm or more and 100 rpm or less and pressure applied to the object to be polished (polishing pressure) is preferably 0.5 psi or more and 10 psi or less. A method of supplying the polishing composition to the polishing pad is not particularly limited, but for example, a method of continuously supplying the composition with a pump or the like (constant flow) is adopted. Though the supply amount is not limited, it is preferred that the surface of the polishing pad is always covered with the polishing composition and 10 mL/min or more and 5000 mL/min or less is preferred. A polishing time is also not particularly limited, but 5 seconds or more and 180 seconds or less is preferred for a step of using the polishing composition.

[Rinse Polishing Step]

A rinse polishing step may be provided between the polishing step and the cleaning step in the method of producing a semiconductor substrate of the present embodiment. Details of the rinse polishing method used in the rinse polishing step are as described for the surface treatment method above.

[Cleaning Step]

A cleaning step is a step of reducing the residues (particularly, organic residues) on the surface of the semiconductor substrate which has been polished by cleaning. Details of the cleaning method used in the cleaning step are as described for the surface treatment method above.

EXAMPLES

The present invention will be further described in detail using the following Examples and Comparative Examples. However, the technical scope of the present invention is not limited to the following Examples. In addition, unless otherwise stated, "%" and "parts" refer to "% by mass" and "parts by mass", respectively.

<Preparation of Composition for Surface Treatment>

Example 1

(Preparation of Composition for Surface Treatment A-1)

0.5 parts by mass of an aqueous maleic acid solution at a concentration of 30% by mass (0.18 parts by mass of maleic acid) as an organic acid, 0.05 parts by mass of sodium polystyrene sulfonate (manufactured by Tosoh Organic Chemical Co., Ltd., Product name: Poly NaSS (registered trademark) PS-1, weight average molecular weight: 20,000, pKa value: 1.0) (0.01 parts by mass of sodium polystyrene sulfonate) as a polymer compound, 0.02 parts by mass of sodium polyoxyethylene (POE) alkyl ether phosphate (n=1) $(C_{18}H_{37}O(POE))_2$—$PO_2Na$) as an anionic surfactant, and an amount to be 100 parts by mass in total of water (deionized water) were mixed, thereby preparing composition for surface treatment A-1. When the pH of composition for surface treatment A-1 (liquid temperature: 25° C.) was confirmed by a pH meter (manufactured by HORIBA, Ltd., product name: LAQUA (registered trademark)), pH was 2.1.

Examples 2 to 9 and Comparative Examples 2 and 3

(Preparation of Compositions for Surface Treatment A-2 to A-9 and a-1 to a-2)

Each composition for surface treatment was prepared in the same manner as in the preparation of the composition for surface treatment A-1 in Example 1, except that the type of the anionic surfactant was changed as shown in the following Table 1. In addition, "-" in the table shows that the component was not used. Also, the pH of each composition for surface treatment is shown in the following Table 1.

<Measurement of Weight Average Molecular Weight>

As the weight average molecular weight of the polymer compound, a value of the weight average molecular weight measured by gel permeation chromatography (GPC) (in terms of polyethylene glycol) was used. The weight average molecular weight was measured by the following apparatus and conditions.

GPC apparatus: manufactured by Shimadzu Corporation
Model: Prominence+ELSD detector (ELSD-LTII)
Column: VP-ODS (manufactured by Shimadzu Corporation)
Mobile phase A: MeOH
B: 1% aqueous acetic acid solution
Flow rate: 1 mL/min
Detector: ELSD temp. 40° C., Gain 8, $N_2$ GAS 350 kPa
Oven temperature: 40° C.
Injection amount: 40 μL.

<Evaluation of the Number of Residues (Defects)>

[Preparation of Object which has been Polished]

A silicon nitride substrate which has been polished, after being polished by the following chemical mechanical polishing (CMP) step was prepared as an object which has been polished (also referred to as a substrate which has been polished).

(CMP Step)

For a silicon nitride substrate which is a semiconductor substrate, a polishing composition M (composition; 4% by mass of sulfonic acid-modified colloidal silica (manufactured by a method described in "Sulfonic acid-functionalized silica through quantitative oxidation of thiol groups", Chem. Commun. 246-247 (2003), a primary particle size of 30 nm, a secondary particle size of 60 nm), 1% by mass of ammonium sulfate, 0.018% by mass of an aqueous maleic acid solution at a concentration of 30% by mass, solvent: water) was used to perform polishing under the following conditions. Here, as the silicon nitride substrate, a 300 mm wafer was used.

(Polishing Apparatus and Polishing Conditions)

Polishing apparatus: FREX300E manufactured by Ebara Corporation
Polishing pad: rigid polyurethane pad IC 1400 manufactured by Nitta Haas Incorporated
Polishing pressure: 2.0 psi (1 psi=6894.76 Pa, the same applies hereinafter)
Rotation number of polishing table: 60 rpm
Rotation number of head: 60 rpm
Supply of polishing composition: constant flowing
Supply amount of polishing composition: 300 mL/min
Polishing time: 60 seconds.

[Cleaning Step]

After the surface of the silicon nitride substrate was polished in the CMP step, the silicon nitride substrate was removed from the polishing table (platen). Subsequently, in the same polishing apparatus, the thus-prepared composition for surface treatment (A-1 to A-9 and a-1 to a-2) or water (deionized water; described as Comparative Example 1 in Table 1 below) was used to clean each silicon nitride substrate which has been polished, by a cleaning method in which the silicon nitride substrate which has been polished is rubbed under the following conditions while the silicon nitride substrate which has been polished is sandwiched from above and below between a sponge made of polyvinyl alcohol (PVA) which is a cleaning brush and pressure is applied.

(Cleaning Apparatus and Cleaning Conditions)

Apparatus: FREX300E manufactured by Ebara Corporation
Rotation number of cleaning brush: 100 rpm
Rotation number of object which has been polished (substrate which has been polished): 100 rpm
Flow rate of cleaning solution (composition for surface treatment or water): 1000 mL/min
Cleaning time: 30 seconds

[Measurement of the Number of Residues (Defects)]

For each cleaned substrate after being cleaned by the above cleaning step, the number of residues were measured by the following procedure. The evaluation results are shown together in Table 1.

The number of residues (defects) of 0.09 μm or more was measured after cleaning the silicon nitride substrate which has been polished using each composition for surface treatment under the above cleaning conditions. SP-2 manufactured by KLA Corporation was used for measurement of the number of residues. The measurement was performed on the remaining portion excluding a 5 mm wide portion from the outer peripheral end of the one surface of the cleaned substrate.

[Evaluation of the Number of Organic Residues]

Each composition for surface treatment was used to clean the silicon nitride substrate which has been polished, under the above-described cleaning conditions, and then the number of organic residues was measured by SEM observation using Review SEM RS6000 manufactured by Hitachi, Ltd. First, 100 defects present in the remaining portion excluding a 5 mm wide portion from the outer peripheral end of one surface of the silicon nitride substrate which has been polished were sampled in the SEM observation. Next, out of the 100 sampled defects, the organic residues were visually determined by SEM observation and the number of the organic residues was confirmed to calculate a ratio (%) of the organic residues in the defects. Then, a product of the number of defects of 0.09 μm or more measured using SP-2 manufactured by KLA corporation in the evaluation of the number of defects described above and the ratio (%) of the organic residues in the defects calculated from the SEM observation result was calculated as the number of organic residues. The evaluation results are shown together in Table 1.

TABLE 1

| Composition for surface treatment | Polymer compound | Anionic surfactant Product name | Anionic surfactant Structure |
|---|---|---|---|
| Comparative Example 1 | Water | — | — | — |
| Comparative Example 2 | a-1 | Present | — | — |
| Comparative Example 3 | a-2 | Present | Sodium straight chain alkylbenzene sulfonate | $C_{18}H_{37}-C_6H_4-SO_3Na$ |
| Example 1 | A-1 | Present | Sodium POE alkyl ether phosphate (n = 1) | $(C_{18}H_{37}O(POE))_2-PO_2Na$ |
| Example 2 | A-2 | Present | Sodium alkyl naphthalene sulfonate | $(C_3H_7)-C_{10}H_4-SO_3Na$ |
| Example 3 | A-3 | Present | Sodium alkylbenzene sulfonate | $C_2H_5-C_6H_4-SO_3Na$ |
| Example 4 | A-4 | Present | POE styrenated phenyl ether ammonium sulfate (n = 10) | $(C_6H_5-CH-CH_3)_3-C_6H_4O(POE)SO_3NH_4$ |
| Example 5 | A-5 | Present | POE styrenated phenyl ether ammonium sulfate (n = 4) | $(C_6H_5-CH-CH_3)-C_6H_4O(POE)SO_3NH_4$ |
| Example 6 | A-6 | Present | Disodium POE lauryl sulfosuccinate (n = 3) | $C_{12}H_{25}O(POE)COCH_2CHCOONa(-SO_3Na)$ |
| Example 7 | A-7 | Present | POE isodecyl ether ammonium sulfate (n = 6) | $C_{10}H_{21}O(POE)SO_3NH_4$ |
| Example 8 | A-8 | Present | POE alkyl(10-12) ether phosphate ester (n = 8) | $C_{12}H_{25}O(POE)PO_3$ |
| Example 9 | A-9 | Present | Sodium POE alkyl (12-14) sulfosuccinate (n = 7) | $C_{12}H_{25}O(POE)COCH_2CHCOONa(-SO_3Na)$ |

| | Anionic surfactant Molecular weight*1 | | | Molecular weight ratio | | | The number of organic residues |
|---|---|---|---|---|---|---|---|
| | Total | Hydrophilic moiety | Hydrophobic moiety | Hydrophilic moiety/hydrophobic moiety | pH | The number of residues | |
| Comparative Example 1 | — | — | — | — | 2.1 | 400000 | 216840 |
| Comparative Example 2 | — | — | — | — | 2.1 | 43 | 23 |
| Comparative Example 3 | 432 | 103 | 329 | 0.31 | 2.1 | 47 | 22 |
| Example 1 | 712 | 206 | 506 | 0.41 | 2.1 | 39 | 13 |
| Example 2 | 270 | 103 | 167 | 0.62 | 2.1 | 30 | 12 |
| Example 3 | 208 | 103 | 105 | 0.98 | 2.1 | 25 | 9 |
| Example 4 | 946 | 554 | 392 | 1.41 | 2.1 | 26 | 8 |
| Example 5 | 471 | 290 | 181 | 1.60 | 2.1 | 27 | 11 |
| Example 6 | 542 | 373 | 169 | 2.21 | 2.1 | 19 | 8 |
| Example 7 | 519 | 378 | 141 | 2.68 | 2.1 | 17 | 9 |
| Example 8 | 638 | 469 | 169 | 2.78 | 2.1 | 19 | 2 |
| Example 9 | 718 | 549 | 169 | 3.25 | 2.1 | 10 | 4 |

*1 In the table, the molecular weight of the anionic surfactant is a value calculated from the sum of the atomic weight.

As shown in Table 1, according to the composition for surface treatment of the present invention (Examples 1 to 9), it was confirmed that the residues on the surface of the object which has been polished including silicon nitride can be sufficiently removed. Among the residues on the surface of the object which has been polished including silicon nitride, silicon oxide, or polysilicon, in particular, the surface of the organic residues having high hydrophobicity such as pad waste is difficult to be removed, but from the above results, it is considered that the organic residues of the surface of the object which has been polished can be also sufficiently removed. Also, according to the composition for surface treatment of the present invention, since the surface of the object which has been polished including polysilicon which has high hydrophobicity can be hydrophilized, it is considered that the composition can be appropriately used for removal of, in particular, the residues on the surface of the object which has been polished including polysilicon.

Meanwhile, it was shown that the composition for surface treatment of Comparative Example 3 using the anionic surfactant having the molecular weight of the hydrophilic moiety/the molecular weight of the hydrophobic moiety of less than 0.4 had the effect of removing the residues which is inferior even to that of Comparative Example 2 which does not include the anionic surfactant.

Also, from a comparison of Example 1 and Example 2, it was shown that by using the anionic surfactant having the molecular weight of the hydrophilic moiety/the molecular weight of the hydrophobic moiety of 0.6 or more, the effect of removing the residues is more improved.

Also, from a comparison of Example 5 and Example 6, it was shown that by using the anionic surfactant having the molecular weight of the hydrophilic moiety/the molecular weight of the hydrophobic moiety of 2.2 or more, the effect of removing the residues is further improved.

Also, from a comparison of Example 8 and Example 9, it was shown that by using the anionic surfactant having the molecular weight of the hydrophilic moiety/the molecular weight of the hydrophobic moiety of 3.2 or more, the effect of removing the residues is further improved.

The present application is based on the Japanese patent application No. 2017-044133 filed on Mar. 8, 2017, and a disclosed content thereof is incorporated herein as a whole by reference.

The invention claimed is:

1. A composition for surface treatment comprising an anionic surfactant having a molecular weight of 1,000 or less and water, the composition for surface treatment having a pH of less than 7,
wherein the anionic surfactant comprises at least one selected from the group consisting of polyoxyalkylene styrenated phenyl ether sulfuric acid (salt) and polyoxyalkylene alkyl sulfosuccinic acid (salt),
wherein a ratio of a molecular weight of a hydrophilic moiety to a molecular weight of a hydrophobic moiety (the molecular weight of the hydrophilic moiety/the molecular weight of the hydrophobic moiety) of the anionic surfactant is 0.4 or more (in which the hydrophobic moiety is a hydrocarbon group having 4 or more carbon atoms and the hydrophilic moiety is a part excluding the hydrophobic moiety and a counterion), and
the composition for surface treatment is used for surface treatment of an object which has been polished including at least one selected from the group consisting of silicon nitride, silicon oxide, and polysilicon.

2. The composition for surface treatment according to claim 1, wherein the anionic surfactant has a sulfonic acid (salt) group or a sulfuric acid (salt) group.

3. The composition for surface treatment according to claim 1, further comprising a polymer compound of a molecular weight of 10,000 or more, having a sulfonic acid (salt) group.

4. The composition for surface treatment according to claim 3, wherein the polymer compound comprises at least one selected from the group consisting of sulfonic acid group-containing polyvinyl alcohol, sulfonic acid group-containing polystyrene, sulfonic acid group-containing polyvinyl acetate, sulfonic acid group-containing polyester, a copolymer of (meth)acryl group-containing monomer-sulfonic acid group-containing monomer, and salts thereof.

5. The composition for surface treatment according to claim 3, wherein a ratio of a content (mass) of the anionic surfactant to a content (mass) of the polymer compound is 1 to 100.

6. The composition for surface treatment according to claim 3, wherein
a content of the polymer compound is 0.001% by mass or more and 1.0% by mass or less, and
a content of the anionic surfactant is 0.01% by mass or more and 1.0% by mass or less.

7. The composition for surface treatment according to claim 1, wherein the anionic surfactant comprises at least one selected from the group consisting of polyoxyethylene styrenated phenyl ether ammonium sulfate, sodium polyoxyethylene alkyl(12-14) sulfosuccinate, and disodium polyoxyethylene lauryl sulfosuccinate.

8. The composition for surface treatment according to claim 1, further comprising a phosphonic acid compound having 2 or more nitrogen atoms.

9. The composition for surface treatment according to claim 1, which includes substantially no abrasive grains.

10. A method of producing the composition for surface treatment set forth in claim 1, comprising a step of mixing an anionic surfactant having a molecular weight of 1,000 or less and water, the composition for surface treatment having a pH of less than 7,
wherein the anionic surfactant comprises at least one selected from the group consisting of polyoxyalkylene styrenated phenyl ether sulfuric acid (salt) and polyoxyalkylene alkyl sulfosuccinic acid (salt),
wherein a ratio of a molecular weight of a hydrophilic moiety to a molecular weight of a hydrophobic moiety (the molecular weight of the hydrophilic moiety/the molecular weight of the hydrophobic moiety) of the anionic surfactant is 0.4 or more (in which the hydrophobic moiety is a hydrocarbon group having 4 or more carbon atoms and the hydrophilic moiety is a part excluding the hydrophobic moiety and a counterion).

11. A surface treatment method comprising a step of surface-treating an object which has been polished including at least one selected from the group consisting of silicon nitride, silicon oxide, and polysilicon, using the composition for surface treatment set forth in claim 1.

12. The surface treatment method according to claim 11, wherein the surface treatment is rinse polishing and/or cleaning.

13. A method of producing a semiconductor substrate, comprising a step of reducing residues on a surface of a semiconductor substrate which has been polished including at least one selected from the group consisting of silicon nitride, silicon oxide, and polysilicon, by the surface treatment method set forth in claim 11.

14. The composition for surface treatment according to claim 1, wherein the anionic surfactant has a polyoxyethylene (POE) group having a number of repeating units n of 3 to 10.

15. The composition for surface treatment according to claim 1, wherein the anionic surfactant comprises alkyl sulfosuccinic acid (salt) containing an alkyl group having 8 or more carbon atoms.

16. The composition for surface treatment according to claim 1, wherein the ratio of a molecular weight of a hydrophilic moiety to a molecular weight of a hydrophobic moiety of the anionic surfactant is 2.2 or more.

* * * * *